(12) United States Patent
Taniguchi et al.

(10) Patent No.: US 7,949,314 B2
(45) Date of Patent: May 24, 2011

(54) TRANSMISSION OUTPUT CONTROL APPARATUS

(75) Inventors: Tetsuyuki Taniguchi, Daito (JP); Hitoshi Tsuchiya, Nara (JP)

(73) Assignee: Kyocera Corporation, Kyoto (JP)

( * ) Notice: Subject to any disclaimer, the term of this patent is extended or adjusted under 35 U.S.C. 154(b) by 1373 days.

(21) Appl. No.: 11/455,670

(22) Filed: Jun. 20, 2006

(65) Prior Publication Data

US 2006/0286947 A1 Dec. 21, 2006

(30) Foreign Application Priority Data

Jun. 21, 2005 (JP) .................................. 2005-180377

(51) Int. Cl.
*H04B 1/04* (2006.01)
*H04Q 11/12* (2006.01)

(52) U.S. Cl. ...................... 455/126; 455/127.3; 455/522; 375/297

(58) Field of Classification Search ................ 455/67.11, 455/126, 127.1, 127.2, 127.3, 69, 522; 375/296, 375/297

See application file for complete search history.

(56) References Cited

U.S. PATENT DOCUMENTS

| | | | | |
|---|---|---|---|---|
| 5,493,707 | A * | 2/1996 | Kamitani | 455/127.2 |
| 5,548,826 | A * | 8/1996 | Sayers | 455/126 |
| 6,728,224 | B1 * | 4/2004 | Kakizaki et al. | 455/127.3 |

FOREIGN PATENT DOCUMENTS

| | | |
|---|---|---|
| JP | 62-151006 | 7/1987 |
| JP | 4-150523 | 5/1992 |
| JP | 9-65432 | 3/1997 |
| JP | 2000-341143 | 12/2000 |

OTHER PUBLICATIONS

JPO document dated Oct. 14, 2008 pertaining to corresponding to Japanese patent application No. 2005-180377.
Verified translation of Office Action issued by JPO dated Oc. 14, 2008, regarding the corresponding Japanese patent application No. 2005-180377.

* cited by examiner

*Primary Examiner* — Quochien B Vuong
(74) *Attorney, Agent, or Firm* — Morrison & Foerster LLP

(57) ABSTRACT

Provided is a transmission output control apparatus including: a level control circuit operable to adjust a level of an inputted signal; a power amplifying circuit including a plurality of amplifying stages and being operable to amplify the signal whose level has been adjusted by the level control circuit; an antenna operable to transmit the signal amplified by the power amplifying circuit; a memory unit operable to prestore a plurality of control signals; a control signal generating unit operable to select and extract, from the memory unit, one of the control signals that is in accordance with a transmission level instructed by a base station, and supply the extracted control signal to the level control circuit; and a detection unit operable to detect a signal at a midway amplifying stage of the power amplifying circuit, where a transmission level of the level control circuit is monitored according to an output of the detection unit.

5 Claims, 2 Drawing Sheets

FIG. 2

| TRANSMISSION POWER MEASUREMENT CIRCUIT | MEMORY CIRCUIT | |
|---|---|---|
| TRANSMISSION POWER | CONTROL SIGNAL | TRANSMISSION POWER SIGNAL |
| A | a | a1 |
| B | b | b1 |
| C | c | c1 |
| ⋮ | ⋮ | ⋮ |
| J | j | j1 |

TRANSMISSION OUTPUT CONTROL APPARATUS

BACKGROUND OF THE INVENTION (1) Field of the Invention

The present invention relates to a transmission output control apparatus for use in a mobile telephone and the like.

(2) Related Art

Conventionally for a mobile telephone, part of the transmission power to be supplied to an antenna is extracted from a directional coupler, so as to maintain the level of the transmission power from the power amplifying circuit to a certain standard power according to the power level of the extracted transmission power.

However, factors such as a metal plate being in the proximity of the antenna or the antenna being touched by a human hand cause the input impedance of the antenna to change. This leads to deterioration in the impedance matching between the antenna side and the transmission circuit side, causing a voltage standing wave to occur. As a result, the level of the transmission power extracted from the directional coupler will be inaccurate, preventing the output power level of the power amplifying circuit from being adjusted to the appropriate standard level.

In view of this, there has already been disclosed a technology of providing an isolator between an antenna and a directional coupler, thereby minimizing the effect of the voltage standing wave (see Japanese Laid-open patent application No. 2000-341143). According to the disclosed technology, when the matching between the transmission side and the antenna side is unfavorable, the antenna reflects back part of the transmission power from the power amplifying circuit, however the isolator obstructs the reflected power to suppress the voltage standing wave.

Generally speaking, however, such an isolator is expensive, and so is presenting one factor preventing the cost reduction of a mobile telephone.

SUMMARY OF THE INVENTION

The present invention has been conceived in view of the stated problems, and has an object of providing a transmission output control apparatus realized at low cost and without using an isolator.

So as to solve the stated problem, the present invention provides a transmission output control apparatus including: a level control circuit operable to adjust a level of an inputted signal; a power amplifying circuit including a plurality of amplifying stages and being operable to amplify the signal whose level has been adjusted by the level control circuit; an antenna operable to transmit the signal amplified by the power amplifying circuit; a memory unit operable to prestore a plurality of control signals; a control signal generating unit operable to select and extract, from the memory unit, one of the control signals that is in accordance with a transmission level instructed by a base station, and supply the extracted control signal to the level control circuit; and a detection unit operable to detect a signal at a midway amplifying stage of the power amplifying circuit, where a transmission level of the level control circuit is monitored according to an output of the detection unit.

Here, it is possible to have a structure in which the memory unit prestores therein a plurality of transmission power signals respectively in correspondence with the control signals, and the transmission level of the level control circuit is monitored by means of an accordance signal outputted as a result of comparison between the output of the detection unit and the transmission power signals.

Further, it is also possible to have a structure in which the transmission output control apparatus further includes a transmission output measurement unit operable to, when being connected to an antenna connector terminal that is under a state of being cut off from the antenna, measure a plurality of transmission outputs, where the control signals are respectively prestored in correspondence with the transmission outputs, and stores the output of the detection unit as a corresponding one of the transmission power signals.

The stated structure of the present invention is designed to, detect a signal at a midway amplifying stage of the power amplifying circuit, and further to monitor control signals by an output of the detection output. This is realized at extremely inexpensive cost because of not necessitating an expensive isolator unlike the case of conventional apparatuses.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings:

FIG. 2 shows a table for explaining the transmission output control apparatus.

DESCRIPTION OF THE PREFERRED EMBODIMENTS

Embodiment

Figure 1:
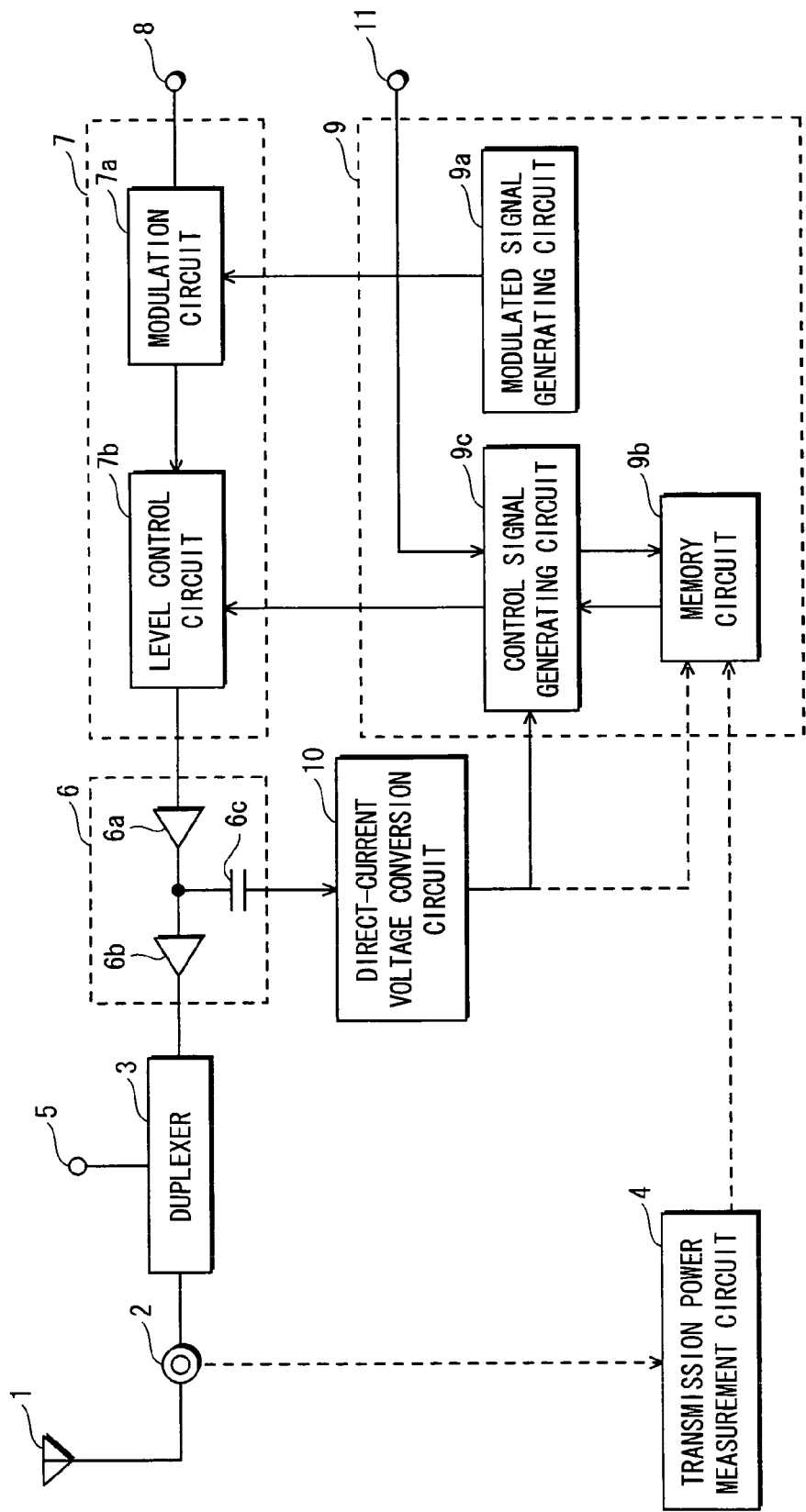
FIG. 1 is a block diagram showing a transmission output control apparatus according to one embodiment of the present invention.

The following describes an embodiment of the present invention with reference to the related drawings.

FIG. 1 is a block diagram showing a main part of a mobile telephone adopting a CDMA method. As shown in this drawing, an antenna 1 is connected to a duplexer via an antenna connector terminal 2. The antenna connector terminal 2 is structured to be cut off from the antenna 1 upon insertion of a measurement terminal of a transmission power measurement apparatus 4, and is widely used for that purpose. The duplexer 3 conveys a transmission signal sent from the power amplifying circuit 6 to the antenna 1, and a reception signal inputted from the antenna 1 to a reception circuit connecting terminal 5, and is also widely used for that purpose.

The power amplifying circuit 6 is made up of a first-stage amplifier 6a and a second-stage amplifier 6b. The first-stage amplifier 6a is provided with a transmission signal from a transmission output control circuit 7. The transmission output control circuit 7 includes a modulation circuit 7a and a level control circuit 7b. The modulation circuit 7a is provided with a modulating signal (input signal) from an input terminal 8, and a modulated signal from a modulated signal generating circuit 9a of a terminal control microcomputer 9. An output signal from the modulation circuit 7a is conveyed to the first-stage amplifier 6a via the level control circuit 7b.

The terminal control microcomputer 9 is further provided with a memory circuit 9b and a control signal generating circuit 9c. An output signal from the control signal generating circuit 9c is conveyed to the level control circuit 7b as a control signal. The control signal generating circuit 9c receives a level instruction signal via a terminal 11, the level instruction signal having been received by a reception circuit from a base station.

An output signal of the first-stage amplifier 6a is conveyed to the second-stage amplifier 6b, and also to a direct-current voltage conversion circuit 10 via a detection coupling capacitor 6c. An output from the direct-current voltage conversion circuit 10 is conveyed to the control signal generating circuit 9c. An output from a transmission power measurement circuit 4 is conveyed to the memory circuit 9b.

The following describes the circuit operation, with reference to FIG. 2. The input signal received at the input terminal 8 is conveyed to the power amplifying circuit 6 after being modulated by the modulation circuit 7a and controlled to a predetermined level by the level control circuit 7b. The signal is amplified by the power amplifying circuit 6, and then goes through the route of the duplexer 3, the antenna connector terminal 2, and the antenna 1, to be finally transmitted from the antenna 1.

As follows, the control performed by the level control circuit 7b is described. First, the terminal 6f the transmission power measurement circuit 4 is connected to the antenna connector terminal 2. In response, the antenna 1 is cut off from the antenna connector terminal 2, and the power of the transmission signal is measured at the transmission power measurement circuit 4, and the measured value of the power is stored in the memory circuit 9b. By keeping the magnitude of the input signal of the input terminal 8 constant, the amplitude of the output signal of the level control circuit 7b is controlled from small to large by means of a control signal outputted from the control signal generating circuit 9c.

Then the transmission power measurement circuit 4 will have signals respectively having levels of A, B, C, . . . J, as shown in FIG. 2, for example. Based on these signals, control signals a, b, c, . . . j respectively corresponding to the signals of the levels of A, B, C, . . . J, are stored in the memory circuit 9b.

Simultaneously, detected signals (transmission power signals) a1, b1, c1, . . . j1, respectively being an output from the direct-current voltage conversion circuit 10, are stored in the memory circuit 9b, by being respectively associated with the control signals a, b, c, . . . j.

The described operation is performed for each mobile telephone. After the described operation completes, the transmission power measurement circuit 4 is removed, and then the antenna 1 is connected back to the antenna connector terminal 2.

Immediately after power activation of the mobile telephone, the terminal 11 is not yet receiving a level instruction signal from a base station. Accordingly, the terminal control microcomputer 9 extracts from the memory circuit 9b a control signal suitable for the input sensitivity of a signal received from the base station and conveys the extracted control signal to the level control circuit 7b. In accordance with the control signal, the level control circuit 7b is controlled, and the antenna 1 sends out a transmission output. Once establishing connection with the base station, the mobile telephone receives a level instruction signal from the base station, and the level instruction signal is inputted to the terminal 11.

When receiving this level instruction signal, the control signal generating circuit 9c selects and extracts an appropriate control signal from the memory circuit 9b, and conveys the extracted control signal to the level control circuit 7b. Here, a level instruction signal is a signal for instructing the output level to be either "raised" or "lowered". Selection of a control signal is performed in accordance with this level instruction signal. According to the stated control, a signal having a transmission level intended by the base-station is transmitted from the antenna 1.

When not able to receive a level instruction signal from a base station, the terminal control-microcomputer 9 outputs a magnified transmission output, so as to enable the base station to recognize that the mobile telephone is within the area managed by the base station. Until being recognized, the mobile telephone repeats a series of operations of magnifying a transmission output and confirming reception of a level instruction signal from the base station.

During the stated series of controls, the output from the direct-current voltage conversion circuit 10 is conveyed to the control signal generating circuit 9c, compared with the transmission power signals stored in the memory circuit 9b. An accordance signal, which results from the above-stated comparison, is used to monitor a control signal currently being applied to the level control circuit 7b. This means that the accordance signal further monitors the level of a transmission signal.

The direct-current voltage conversion circuit 10A detects a signal at a midway amplifying stage (i.e. between the first-stage amplifier 6a and the second-stage amplifier 6b in this example) of the power amplifying circuit 6, and obtains a detection output. This detection output is conveyed to the control signal generating circuit 9c, enabling selection of the control signals a, b, c, . . . j that correspond to the transmission power signals a1, b1, c1, . . . j1 of the memory circuit 9b.

Factors such as a metal plate being in the proximity of the antenna 1 or the antenna 1 being touched by a human hand cause the input impedance of the antenna 1 to change. This leads to deterioration in the impedance matching between the antenna side and the transmission circuit side, causing a voltage standing wave to occur between the power amplifying circuit 6 and the antenna 1. The present invention, however, is designed to detect a signal at a midway amplifying stage of the power amplifying circuit 6, and convey the detection output to the control signal generating circuit 9c. Therefore, the detection output will not be affected by the stated effect of voltage standing waves. To be more specific, the second-stage amplifier 6b of the power amplifying circuit 6 has the identical function as that of a signal attenuator, which prevents the voltage standing wave from affecting the input side of the second-stage amplifier 6b. As a result, it becomes possible to control the output power level of the power amplifying circuit 6 to the appropriate standard level. The stated structure of detecting a signal at a midway amplifying stage of the power amplifying circuit 6 is realized at extremely inexpensive cost because of not necessitating an expensive isolator unlike the case of conventional apparatuses.

In FIG. 1, the power amplifying circuit 6 adopts two stage system (i.e. two amplifiers). However not limited to this, the power amplifying circuit 6 may adopt a three stage system or a four stage system (three or four amplifiers). In addition, the stage in which signal extraction is performed should be as early as possible for the purpose of Preventing the effect of the voltage standing wave, but then the decrease in signal level is expected. So as to counter this problem, it is desirable to provide an amplifier after the stage in which signal extraction is performed.

Although the present invention has been fully described by way of examples with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A transmission output control apparatus comprising:
a level control circuit operable to adjust a level of an inputted signal;
a power amplifying circuit including a plurality of amplifying stages and being operable to amplify the signal whose level has been adjusted by the level control circuit;
an antenna operable to transmit the signal amplified by the power amplifying circuit;
a memory unit operable to prestore a plurality of control signals;
a control signal generating unit operable to select and extract, from the memory unit, one of the control signals that is in accordance with a transmission level instructed by a base station, and supply the extracted control signal to the level control circuit; and
a detection unit operable to detect a signal at a midway amplifying stage of the power amplifying circuit, wherein
a transmission level of the level control circuit is monitored according to an output of the detection unit,
the power amplifying circuit includes at least three amplifiers, and
the midway amplifying stage is included in amplifying stages between every two consecutive amplifiers of the at least three amplifiers, and is not the most distant from the level control circuit among the amplifying stages.

2. The transmission output control apparatus of claim 1, wherein
the memory unit prestores therein a plurality of transmission power signals respectively in correspondence with the control signals, and
the transmission level of the level control circuit is monitored by means of an accordance signal outputted as a result of comparison between the output of the detection unit and the transmission power signals.

3. The transmission output control apparatus of claim 2, further comprising:
a transmission output measurement unit operable to, when being connected to an antenna connector terminal that is under a state of being cut off from the antenna, measure a plurality of transmission outputs, wherein
the control signals are respectively prestored in correspondence with the transmission outputs, and stores the output of the detection unit as a corresponding one of the transmission power signals.

4. The transmission output control apparatus of claim 1, wherein
the at least three amplifiers are connected in series between the level control circuit and the antenna.

5. The transmission output control apparatus of claim 1, further comprising
an amplifier operable to amplify the detected signal.

* * * * *